United States Patent
Schnackel

(10) Patent No.: US 12,208,821 B1
(45) Date of Patent: Jan. 28, 2025

(54) STORAGE EFFICIENT DATA REPRESENTATION OF THREE-DIMENSIONAL OBSTRUCTIONS FOR ROUTING MECHANICAL, ELECTRICAL, AND PLUMBING (MEP) SYSTEMS

(71) Applicant: Schnackel Engineers, Inc., Omaha, NE (US)

(72) Inventor: Gregory R. Schnackel, Miami, FL (US)

(73) Assignee: Schnackel Engineers, Inc., Omaha, NE (US)

( * ) Notice: Subject to any disclaimer, the term of this patent is extended or adjusted under 35 U.S.C. 154(b) by 538 days.

(21) Appl. No.: 17/477,460

(22) Filed: Sep. 16, 2021

Related U.S. Application Data

(60) Provisional application No. 63/079,678, filed on Sep. 17, 2020.

(51) Int. Cl.
*G06T 19/00* (2011.01)
*B60W 60/00* (2020.01)
*G01C 21/34* (2006.01)
*G06T 19/20* (2011.01)

(52) U.S. Cl.
CPC ..... *B60W 60/0016* (2020.02); *G01C 21/3453* (2013.01); *G06T 19/003* (2013.01); *G06T 19/20* (2013.01); *B60W 2556/40* (2020.02); *B60W 2556/50* (2020.02); *G06T 2219/2004* (2013.01)

(58) Field of Classification Search
CPC ......... B60W 60/0016; B60W 2556/50; B60W 2556/04; G01C 21/3453; G06T 19/003; G06T 19/20; G06T 2219/2004
See application file for complete search history.

(56) References Cited

U.S. PATENT DOCUMENTS

| | | | |
|---|---|---|---|
| 2006/0247902 A1* | 11/2006 | Rourke | G06F 30/15 703/1 |
| 2009/0309898 A1* | 12/2009 | Nakamura | G06T 11/203 382/167 |
| 2010/0179788 A1* | 7/2010 | Santina | G06F 30/13 703/1 |
| 2020/0072613 A1* | 3/2020 | Kuzmanovic | G06T 17/05 |
| 2020/0368616 A1* | 11/2020 | Delamont | H04N 13/239 |
| 2021/0375062 A1* | 12/2021 | Fleischman | G06V 30/274 |
| 2022/0055213 A1* | 2/2022 | Kang | G05B 17/02 |
| 2023/0146207 A1* | 5/2023 | Parekh | G06F 30/13 703/1 |
| 2023/0168686 A1* | 6/2023 | Tateno | G05D 1/0219 700/28 |
| 2023/0342508 A1* | 10/2023 | Ronen | G06F 30/27 |

\* cited by examiner

*Primary Examiner* — Jess Whittington
*Assistant Examiner* — Terry C Buse
(74) *Attorney, Agent, or Firm* — Fenwick & West LLP

(57) ABSTRACT

A system uses a storage efficient data representation to route mechanical, electrical, or plumbing (MEP) objects of variable cross-sectional area through a bounded three-dimensional space containing obstructions of varying size and complexity. The system uses the triangular representations of the surfaces of the space in which the systems are to be routed. The system creates a computationally efficient 3D model that accurately represents the physical constraints of the space to be traversed and ensures that the routes are built within the constraints of the physical possibility requirements with no conflicts between different types of the MEP objects being routed.

20 Claims, 5 Drawing Sheets

STORAGE EFFICIENT DATA REPRESENTATION OF THREE-DIMENSIONAL OBSTRUCTIONS FOR ROUTING MECHANICAL, ELECTRICAL, AND PLUMBING (MEP) SYSTEMS

CROSS-REFERENCES TO RELATED APPLICATIONS

This application claims the benefits of U.S. Provisional Application No. 63/079,678, filed on Sep. 17, 2020, which is incorporated by reference in its entirety.

BACKGROUND

Field of Art

This disclosure relates in general to storage efficient data representations for efficient data processing in general and more specifically to storage efficient data representation for routing through three-dimensional spaces comprising obstructions.

Description of the Related Art

Three-dimensional routing techniques may be used for several applications including for navigating autonomous vehicles, routing of robots through obstructions, routing for circuit designs, routing of wiring in a building, and so on. Routing through three-dimensional space may be performed using techniques such as minimum spanning tree (polynomial time) or the Steiner tree problem through graph representation of objects in the three-dimensional space. These problems are very computation intensive problems and require significant computing resources for processing. As a result, three-dimensional routing can take significantly long time to process.

Various data representations may be used for representing the three-dimensional space through which routing is performed. Conventional techniques for representing the three-dimensional space are storage inefficient and take large amount of storage to represent even small portions of the three-dimensional space. Inefficient data representations can take a long time to process since all data cannot be loaded in memory at the same time for processing. As a result, most of the data may be stored in storage systems that are slow resulting in frequent swapping of data from memory for performing the routing process. This can cause the three-dimensional routing process to run inefficiently and take long time to process.

SUMMARY

Embodiments use a storage efficient data representation to route an object of variable cross-sectional area through a bounded three-dimensional space containing any number of obstructions of varying size and complexity. The computing system aims to find the most efficient route of the object through the obstructed space, rather than just any random path. Furthermore, the system routes and coordinates multiple MEP ((mechanical, electrical, and plumbing) systems through the same overall bounded space, ensuring there are no physical or other conflicts between the systems. The route of each MEP system is heavily dependent on the routing of the other MEP systems in the design, resulting in a multitude of alternative routings that are analyzed in order to achieve the optimized solution.

Embodiments utilize an efficient three-dimensional modeling environment on which the routing optimization programs can operate. The modeling environment utilizes triangular shaped surface representations of all 'obstructions' to the routing of the pipes, ducts and conduits. These 'obstructions' include the portions of the building intended for human habitation, as well as the architecture, structure and other building services systems in the building. The triangles used to represent each surface in the bounded area are established to be as large as possible to minimize the size of the database and the number of elements that the routing algorithms have to process to ensure optimized designs and a conflict free solution. In an embodiment, each surface is individually addressed and assigned specific properties such as permeable, impermeable, fixed, etc. Based on these simple triangular surfaces, the system ensures there are no conflicts with other systems (or with habitable space) that may desire to occupy the same 3D space. The use of triangles, which are inherently planar and therefore known to be computationally efficient, to represent obstructions and other building systems, reduces the complexity of the routing calculations due to the smaller and more efficient database structure.

Figure 1:
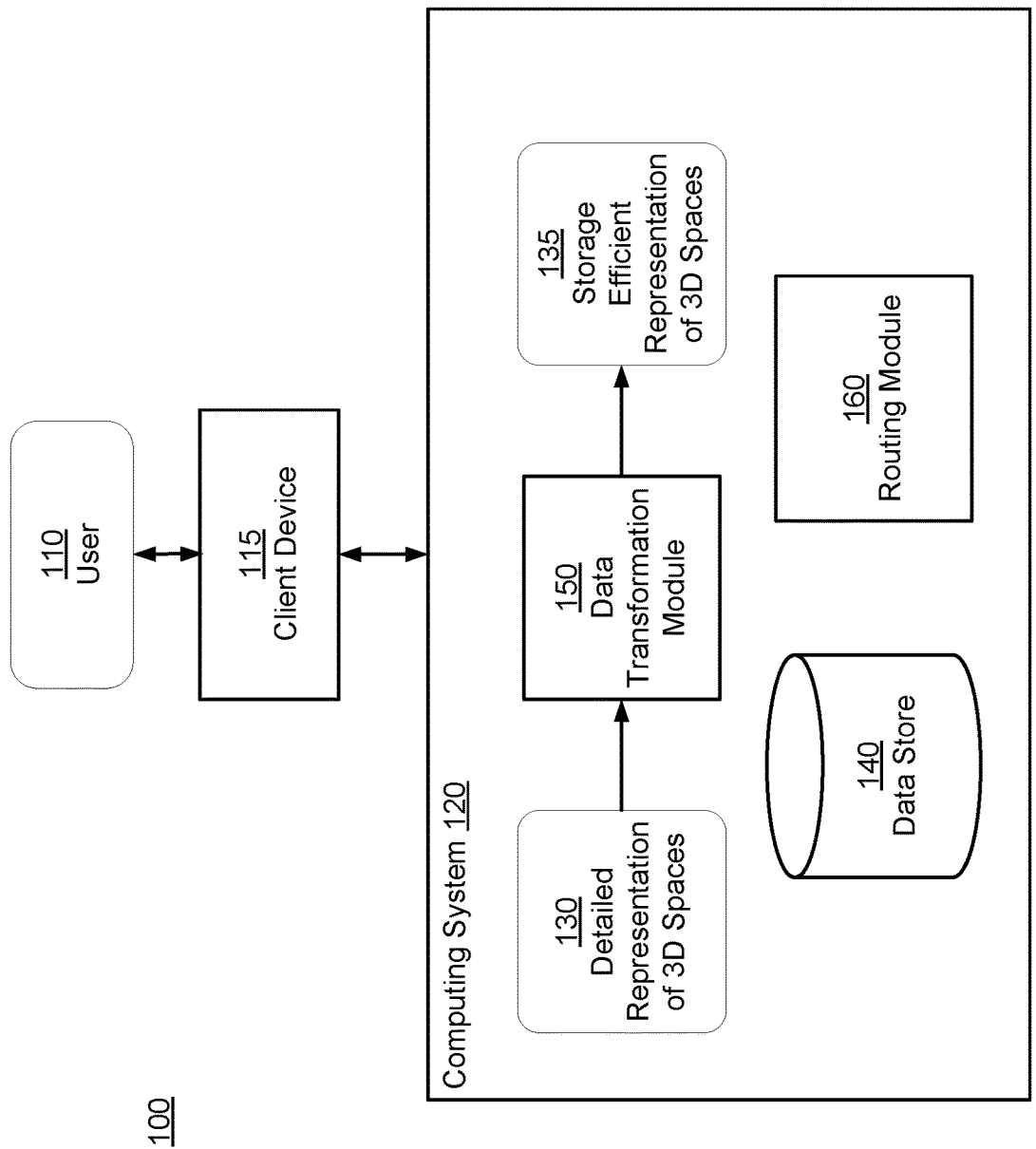
FIG. 1 is a block diagram of a system environment 100 for performing three-dimensional routing according to an embodiment.

The figures depict various embodiments for purposes of illustration only. One skilled in the art will readily recognize from the following discussion that alternative embodiments of the structures and methods illustrated herein may be employed without departing from the principles of the embodiments described herein.

The figures use like reference numerals to identify like elements. A letter after a reference numeral, such as "115a," indicates that the text refers specifically to the element having that particular reference numeral. A reference numeral in the text without a following letter, such as "115," refers to any or all of the elements in the figures bearing that reference numeral.

DETAILED DESCRIPTION

Embodiments of the invention perform routing through three-dimensional spaces to find the most efficient path of objects of variable cross-sectional area through a defined space of any constrained size containing any number of three-dimensional obstructions of varying sizes and complexities. The techniques disclosed have various applications including gaming, VLSI circuit design, infrastructure projects, manufacturing design technologies and other dynamic routing applications.

The system uses an efficient 3D modeling environment that accurately represents the physical constraints of the space including any obstructions within the space. The system accomplishes this automated routing effort in a non-exponential time frame. A computationally efficient 3D modeling environment uses the concept of triangular representations of the surfaces of the space in which the systems are to be routed. Triangles provide the most memory compact and computationally efficient way to store the modeling data necessary to allow the routing algorithms to not only optimize the routes individually, but also coordinate all systems to achieve a zero conflict result.

An application of this technology is in the construction industry, for the routing of pipes, ducts and conduits through buildings, while avoiding any clashes with other systems and with the architecture and structure of the building. Conventional techniques utilize human engineering that is inefficient in cost, materials, labor and energy. Embodiments of the invention replace the human engineering aspects of routing building systems with automated artificial intelligence (AI) techniques that perform this work faster and more efficiently compared to conventional human design methods.

Embodiments of the invention perform automatic routing of systems, of any type, through a three-dimensional obstructed space following the optimally efficient path. This is a very significant computational challenge. It is a complex version of the either the Minimum Spanning Tree (polynomial time) or the Steiner Tree problem, which is an NP-hard algorithm with quasi-polynomial time complexity. It is complicated by the need to route an object of variable cross-section around obstructions to the path between Point A and Point B connecting to other points in 3D space as required by the system being designed. The object being extruded through space has the added complexity that it can vary in cross-sectional shape and size along its path. Additionally, the efficiency of one segment of the tree depends on the cumulative load on all child segments in the tree, so attaching a branch at a different location can change the cross-sectional area and shape ('cost') throughout the system. The system creates a computationally efficient 3D model that accurately represents the physical constraints of the space to be traversed and ensures that the routes are built within the constraints of the physical possibility requirements with no conflicts between systems. Embodiments of the invention include a computationally efficient modeling environment combined with routing optimization techniques that uses cloud computing power and real-time material and labor costing data available in the cloud platform to achieve the optimal solution for each project on a regionalized, up-to-date cost analysis that is constantly changing as market conditions evolve.

System Environment

FIG. 1 is a block diagram of a system environment 100 for performing three-dimensional routing according to an embodiment. The system environment 100 includes a computing system 120 that communicates with users via client devices 115. The multi-computing system 120 includes a data transformation module 150, a routing module 160, and a data store 140. The computing system 120 may include other components not shown in FIG. 1, for example, other types of data stores, and so on. The system environment 100 may include other elements not shown in FIG. 1, for example, a network. In other embodiments, the computing system 120 may be any online system. The computing system 120 may be referred to herein as a system.

The computing system receives a detailed representation 130 of 3D space representing a region. The region represented by the 3D space represents the environment through which routing needs to be performed. Accordingly, the region includes portions (or subregions or objects) that represent obstructions through which routing cannot be performed and portions through which routing can be performed.

The data transformation module 150 receives a detailed representation 130 of 3D spaces and transforms the detailed representation into a storage efficient representation. The data transformation module 150 stores the storage efficient representation 135 of the 3D spaces into the data store 140. The routing module 160 processes the storage efficient representation 135 of the 3D spaces to perform routing through the 3D spaces. The routes generated may be presented via a user interface displayed via the client device 115 to a user 110.

In an embodiment, the detailed representation 130 of 3D spaces is a Revit format (also referred to as Autodesk Revit format) used by building information modeling (BIM) software used in architecture, engineering, construction industry for design and construction of buildings and other structures. The detailed representation 130 of 3D spaces may be any other format, for example, a point cloud representation. The computing system may convert a point cloud representation to a Revit representation before further transforming the data to the storage efficient representation 135 of the 3D spaces.

Revit has a very data intensive database structure that makes it highly computation intensive process to route systems through the Revit model. The 3D space models represented using Revit can require large amount of storage and include large amount of details of the 3D space. The details stored in the Revit format is typically not relevant for purposes of determining obstructions and routing through buildings. Revit model databases are typically several gigabytes in size and can reach terabytes on large buildings. It is extremely difficult (almost impossible with state of the art computing system) to work within the Revit database format because the computing systems are not able to store the data in the processor memory to perform the necessary calculations for the routing processes. The large size of Revit representation of 3D spaces is caused primarily by the level of detail represented within the format. Systems and components (called families) carry highly detailed information that is not relevant for engineering routing calculations.

In an embodiment, the storage efficient representation 135 of the 3D space is in a data format that represents surfaces of the 3D space using triangles, such that each triangle is represented using three coordinate points and the characteristics of the surface (system type, material, penetration cost, etc.). Furthermore, the storage efficient representation 135 of the 3D spaces classifies different regions of the 3D space based on their attributes relevant for routing. For example, a particular region may be marked as impenetrable or not routable 3D space and another region may be marked as penetrable or routable space. For example, the computing system classifies exterior walls of the building, major structural members, elevator shafts, skylights, and so on as impenetrable obstructions that cannot be crossed at any cost. Piping, ductwork or conduits cannot be running outside of the building or in the elevator shafts, for example. The type of obstruction and its penetrability are defined during the tessellation process based on the object type in the input XML (extensible markup language) or Revit data file. The XML data format can used for transferring structured data between programs, as well as reading the Revit data file directly for inputs.

The storage efficient representation 135 of the 3D spaces allows the computing system to load the entire data representation of a building from routing point A to routing point B into processor memory, including all potential obstructions. As a result, the processor does not have to continually swap regions of the data set in and out of memory to calculate the routes. This makes the routing process using the storage efficient representation 135 of the 3D spaces significantly more efficient.

In an embodiment, the computing system generates a storage efficient representation 135 by performing triangulation of surfaces representing various objects and regions of a 3D space. Accordingly, each surface or a portion of surface is represented using the minimum number of triangles necessary to define the obstruction. The storage efficient representation used for routing and obstruction detection are represented as a set of coordinates of points in 3D space loaded into the computer's memory. Once the computing system reduces an object to the minimum number of triangles needed to represent its extents using a minimum of memory, the computing system may store the object as a set of three-dimensional coordinate points that represent the corners of the tessellated triangles, rather than in its native XML or Revit object definition. The object itself is removed from the database and all that remains is a set of coordinate points (triangles) with their required characteristics representing all obstructions within the 3D space. The storage efficient representation makes it computationally simple to determine if a particular route intersects with one of the triangles, thereby hitting an obstruction.

Triangles provide the most efficient representation of a surface for determining whether an object being routed is likely to hit an obstruction. The amount of storage used to represent each triangle is independent of the size of the triangle. As a result, the computing system is able to represent a large obstruction as well as a small obstruction using same amount of memory. A triangle is represented a set of three coordinates, which are likely shared with other abutting triangles. Each new triangle only requires one additional coordinate point, as two of them are likely already shared with adjacent surface triangles. This result in a very rough, but sufficient, tessellation of the 3D space. This representation is very efficient both in terms of data storage and in terms of the computational ease of determining if a computed route will intersect with the plane of an obstruction triangle.

The computing system determines whether an object being routed hits an obstruction by calculating whether portions of the object being routed (or edges of the object being routed) intersect with triangles representing the surface of the obstruction. For example, the computing system determines that an object being routed intersects an obstruction if a point P1 of the object is on one side of a surface of the obstruction and a point P2 of the object is on the other side of the same surface. The points P1 and P2 may represent vertices of an object, for example, an object being routed. The surface is represented using a set of triangles. The computing system may check different portions of the object being routed, for example, different edges of the object by comparing them with triangles representing surfaces and determining whether the edges intersect the triangle. The computing system may select different pairs of vertices of the object being routed against triangles representing the surfaces of obstructions to determine whether a segment formed by the pair of vertices intersects the plane formed by the triangle. If the computing system determines that the segment formed by the pair of vertices intersects the plane formed by the triangle, the computing system determines that the object being routed intersects the obstruction.

If an object being routed hits an obstruction, the object may be moved to modify the route being calculated. For certain types of objects being routed, the size of the object may be adjusted to ensure that the object does not intersect an obstruction. For example, if ducts are being routed through a building, the computing system may modify the size of the duct to avoid an obstruction. In some embodiments, the computing system calculates the amount of overlap between the object being routed and a penetrable region to determine the cost of routing through the penetrable region. The calculation of the amount of overlap uses the triangular representation of surfaces to efficiently load the 3D spaces as well as the object being routed. The ability to load the set of objects being routed as well as the relevant region through which the objects are being routed makes it highly efficient to be able to perform the computations in memory, without having to swap data.

A region that is marked as penetrable or routable may be associated with a cost measure indicative of a degree of difficulty in routing through the region. For example, a region may represent empty space through which routing can be performed easily with low cost. Alternatively, a region may represent a solid object through which routing may be performed by drilling holes. Accordingly, such region has a higher degree of difficulty of routing through the region and is associated with a higher cost measure. Different such solid regions may be associated with different degrees of difficulty of routing and different cost measures depending on their physical properties, for example, hardness, rating or density of the penetrated material.

Although the above description mentions the Revit format as an example detailed representation of 3D spaces or objects and the triangulation-based data format as the storage efficient format, the techniques disclosed herein are applicable to other data formats. For example, the storage efficient format may be based on YAML or even plain text format for representing triangles. The data store 140 stores the various data representations of the 3D spaces and the objects being routed through the 3D spaces.

The computing system 120 and client devices 115 shown in FIG. 1 represent computing devices. A computing device can be a conventional computer system executing, for example, a Microsoft™ Windows™-compatible operating system (OS), Apple™ OS X, and/or a Linux OS. A computing device can also be a device such as a personal digital assistant (PDA), mobile telephone, video game system, etc.

The client devices 115 may interact with the computing system 120 via a network (not shown in FIG. 1). The network uses a networking protocol such as the transmission control protocol/Internet protocol (TCP/IP), the user datagram protocol (UDP), internet control message protocol (ICMP), etc. The data exchanged over the network can be represented using technologies and/or formats including the hypertext markup language (HTML), the extensible markup language (XML), etc.

System Architecture

Figure 2A:
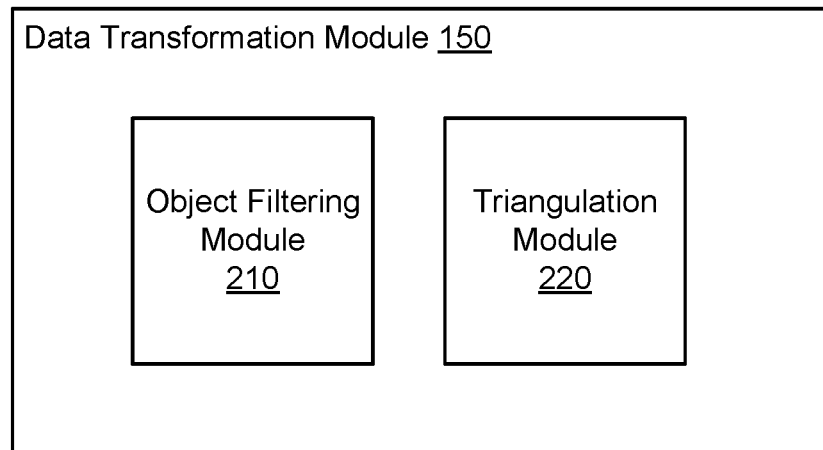
FIG. 2A is a block diagram illustrating components of the data transformation module, according to an embodiment.

FIG. 2A is a block diagram illustrating components of the data transformation module, according to an embodiment. The data transformation module 150 includes an object filtering module 210 and a triangulation module 220. Other embodiments can have different and/or other components than the ones described here. Furthermore, the functionalities described herein can be distributed among the components in a different manner.

The object filtering module 210 removes objects from a 3D space that are not relevant to routing through the 3D space. In an embodiment, the computing system determines whether a 3D object is within another 3D object that is marked as impenetrable. If the computing system determines a 3D object O1 is within another 3D object O2 that is marked as impenetrable, the computing system removes the object O1 as not being relevant to routing. This is so because any object being routed that intersects object O1 will also intersect object O2. Therefore, determining intersection with object O2 is sufficient to detect whether the object can be routed in the 3D space.

The triangulation module 220 performs triangulation of surfaces of various objects in the 3D space. The process of triangulation is also referred to herein as tessellation. The process of triangulation of a 3D object depends on the shape of the object. For example, if the 3D object is a rectangular block, the triangulation module 220 identifies the various flat surfaces of the rectangular block and triangulates them. The computing system may represent each corner of the rectangular block using up to 6 triangles, making up three faces of the rectangular block. The computing system may represent the entire rectangular block using 8 coordinates and 12 triangles.

The computing system may represent cylinders, as well as any other curved surfaces, by breaking them into a series of flat surfaces with a sufficiently low resolution to minimize the number of triangles generated. On very large curves the computing system may use a deviation of a threshold distance beyond the actual arc of the curve, circumscribed on the curve. The computing system circumscribes the curve so that the computing system is slightly overstating the actual area consumed to avoid any potential for a collision with the actual curve after routing. The deviation threshold distance is represented as a variable that the computing system adjusts depending on the size of the cylinder or the type of object represented by the cylinder or the curved shape (for example, whether the cylinder represents a pipe, a column or a large curved wall). In an embodiment, this parameter is experimentally adjusted as necessary to balance resolution with data set size.

The computing system processes other shapes such as spheres, similarly as described above for cylinders. The computing system tessellates them to the minimum number of triangles necessary to represent them in an efficient manner without unnecessarily overstating their actual size. Depending on the size of the sphere, the deviation from the actual surface is typically limited to a threshold value like other curved surfaces. The computing system ensures that the sphere or any curved surface is avoided as an obstruction during routing without overly burdening the data set with an unnecessary number of triangles.

According to various embodiments, the system determines the minimum number of triangles that can be generated to ensure the obstruction is defined and processed in the routing algorithms. The system generates the set of largest triangles that represent each surface of an obstruction in the 3D space, thereby limited the data set size.

In the case of planar surfaces, like walls, ceilings, floors, etc. the system determines the set of the largest inscribed triangles to match the geometry of the surface. In the case of a single, flat wall, two triangles will represent the entirety of the surface. Adjacent walls can then be modeled by only adding two more data points for the next two triangles to represent that adjacent wall or surface. This process continues until all connecting surfaces have been represented by corner points of triangles, most of which are shared by a minimum of 6 other adjacent triangles.

The system processes curved surfaces by using circumscribed triangles to represent the outer extents of the curved surface. Since the goal of the system is to avoid that curved surface during routing, the system uses less than a threshold number of triangles to represent a pipe for example. An entire continuous length of pipe may be represented by 8 triangles made up of only 8 data points.

Larger curved surfaces, for example a long curving wall, are broken down into a series of flat surfaces with a maximum deviation from the actual surface of approximately 4" (adjustable). These flat surfaces are also circumscribed to the actual curve to ensure that the system avoids the obstruction while routing MEP systems. These representative flat surfaces are then modeled as pairs of adjacent triangles requiring only two more data points for each segment of the curve.

In the case of flat surfaces, the system may generate a triangle based a representation that is 100% accurate. In the case of curved surfaces, the system uses an adjustable threshold deviation to ensure a miss of the obstruction during routing without wasting any space or reducing the efficiency of the routed systems.

Figure 2B:
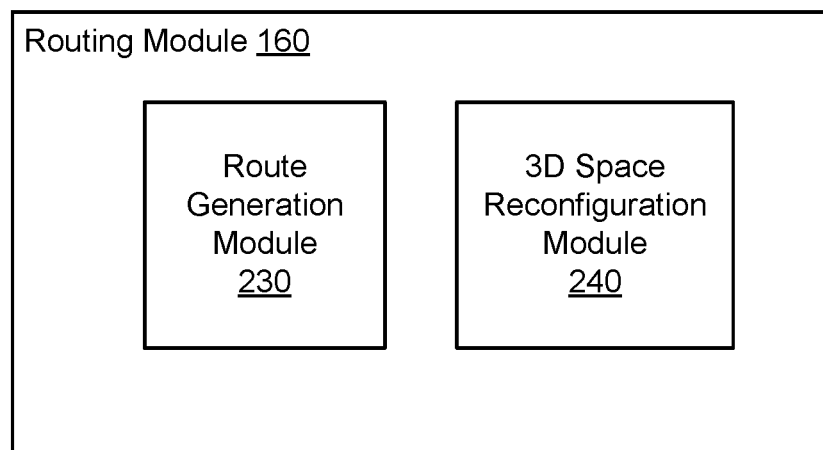
FIG. 2B is a block diagram illustrating components of the routing module, according to an embodiment.

FIG. 2B is a block diagram illustrating components of the routing module, according to an embodiment. The routing module 160 includes a route generation module 230 and a 3D space reconfiguration module 240. Other embodiments can have different and/or other components than the ones described here. Furthermore, the functionalities described herein can be distributed among the components in a different manner.

The route generation module 230 uses various techniques to generate potential routes through the 3D space while avoiding the obstructions. The routing module 160 may generate routes incrementally. For example, routing module 160 may generate potential routes for different types of material in each increment, such as pipes may be routed in one iteration and wires routed in another iteration. The routing module 160 may treat the route as a collection of various subsets of objects and generate routes for each subset of object in an iteration. A subset of objects being routed may be referred to as a system, i.e., MEP system (mechanical, electrical, and plumbing system). For example, one subset of objects may represent the wiring for a building and another subset may represent pipes for the building.

In an embodiment, the route generation module 230 starts with architectural and structural obstructions and attempts to route all MEP systems around them, or through them when they are permitted to be penetrated. It is possible that routing cannot be completed due to insufficient space. This is rare, but when it happens the route generation module 230 notifies the user of the situation so that the 3D space representing the building can be revised and routing restarted once sufficient space has been allocated.

As the route generation module 230 routes additional MEP systems through the space, they are included in the obstruction dataset for the next set of utilities to be routed. The routing becomes more and more congested as each additional MEP system is routed, and all subsequent routing processes consider the prior routed MEP systems as impenetrable obstructions. For example, ducts cannot occupy the same 3D space as the other MEP systems in the building, like pipes and conduits.

The routing module determines which routing combination will be the most efficient routing by testing various alternatives. The routing module iterates through multiple combinations of routing sequences and tests them all to find the lowest overall cost of construction. This occurs for each system individually, and also for the overall data set containing all systems to be routed. For example, the routing module may route sanitary pipe, vent pipe, ductwork, water pipe, sprinkler pipe, gas pipe and then conduits in one test sequence and then change the order to see if there is a better (less costly) route using a different sequence. The routing module may test several sequences in order to determine the best solution that routes all MEP systems without any conflicts between the MEP systems and without any non-permitted conflicts with the architectural and structural elements.

Once the route corresponding to a subset of objects is finalized, the 3D space reconfiguration module 240 reconfigures the 3D space representing the obstructions by adding the subset of objects to the set of obstructions of the 3D space. Accordingly, the objects from the subset are marked as impenetrable and added as obstructions to the 3D surface data set. Accordingly, while routing the next subset of objects, the computing system treats all previous subsets of objects that were routed as obstructions. For example, if the routing of pipes is finalized, the routed pipes are added as obstructions to the building representation and the computing system treats the pipes as obstructions while routing wiring for the building.

Data Transformation Process

Figure 3:
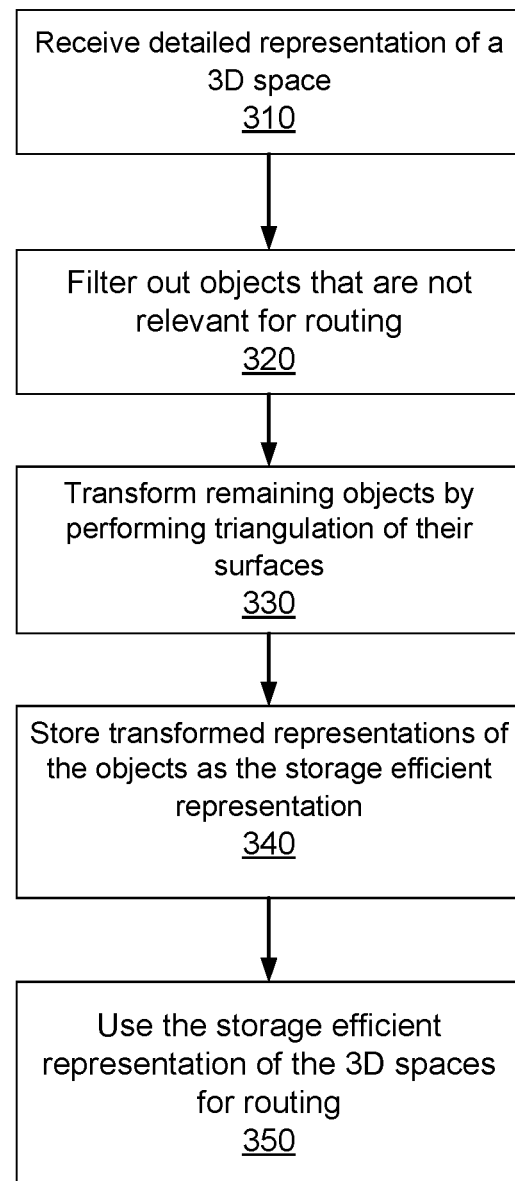
FIG. 3 is a flow chart illustrating the process of data transformation of 3D spaces from the detailed representation to a storage efficient representation according to an embodiment.

FIG. 3 is a flow chart illustrating the process 300 of data transformation of 3D spaces from the detailed representation to a storage efficient representation according to an embodiment. Other embodiments can perform the steps of the flowchart in different orders. Furthermore, various embodiments can include different and/or additional steps than the ones described herein.

The computing system receives 310 a detailed representation of a 3D space representing obstructions through which routing needs to be performed. The computing system filters 320 out at least a subset of objects representing obstructions from the 3D space based on a determination that the objects from the subset are not relevant for routing. For example, the computing system filters out an object that is determined to be is within another larger 3D object that is marked as impenetrable.

The computing system transforms 330 the remaining objects by performing triangulation. The computing system stores 340 the transformed representation of the objects as the storage efficient representation of the 3D space. The computing system uses 350 the stored storage efficient representation of the 3D space for performing routing through the obstructions represented within the 3D space.

Routing Process

Figure 4:
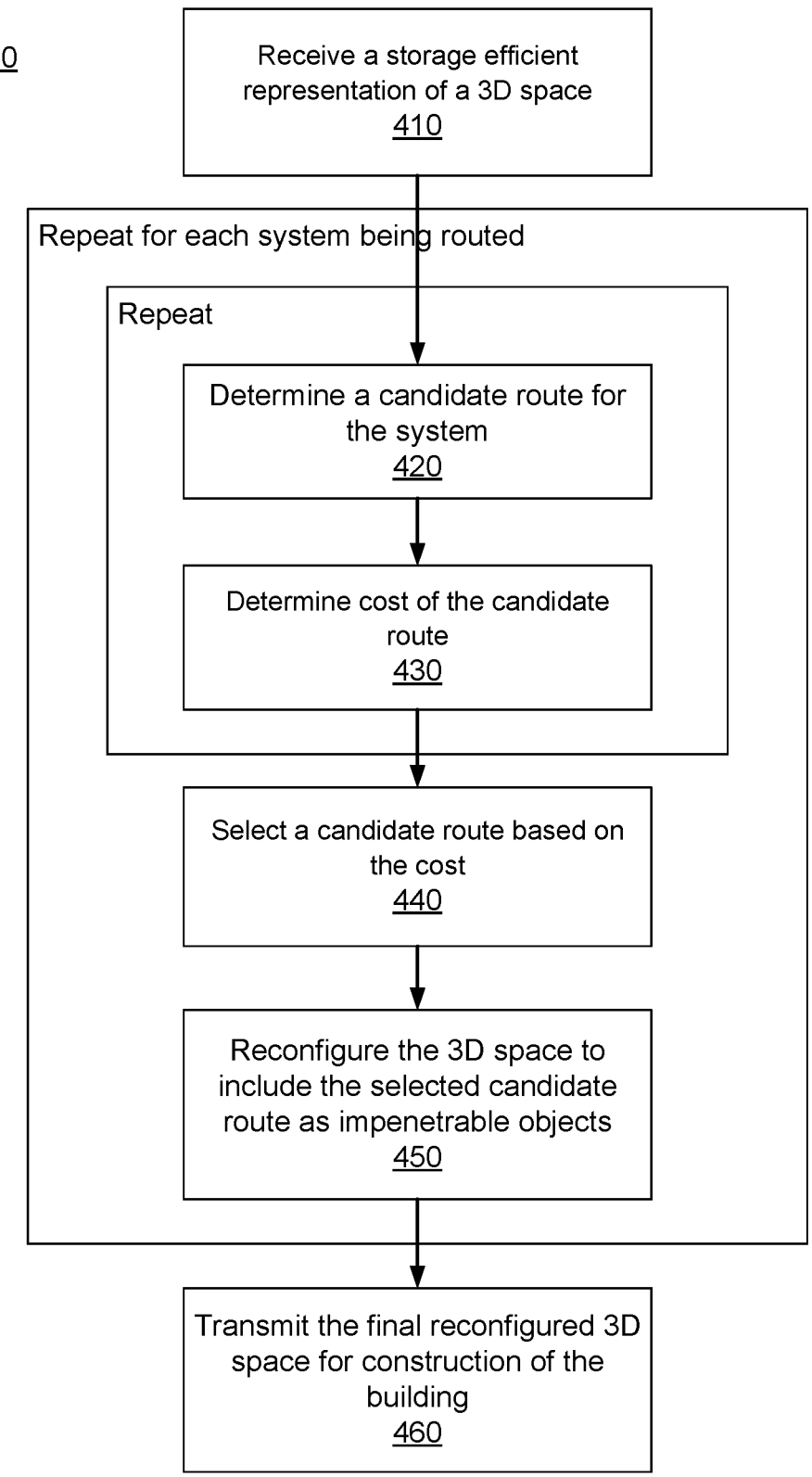
FIG. 4 is a flow chart illustrating the process of routing through the 3D spaces using the storage efficient representation of the 3D spaces according to an embodiment.

FIG. 4 is a flow chart illustrating the process of routing through the 3D spaces using the storage efficient representation of the 3D spaces according to an embodiment. Other embodiments can perform the steps of the flowchart in different orders. Furthermore, various embodiments can include different and/or additional steps than the ones described herein. The steps of the process illustrated in FIG. 4 may represent details of the step 350 of the flowchart illustrated in FIG. 3.

The computing system receives 410 a storage efficient representation of a 3D space representing regions through which routing needs to be performed as well as obstructions that need to be avoided while performing the routing. The routing 3D space may represent a building. The routing needs to be performed for one or more MEP systems (mechanical, electrical, and plumbing systems). An MEP system may represent a different type of material for which routing needs to be performed. For example, one MEP system may represent pipes to be routed through the building and another MEP system may represent electrical wiring to be routed through the building.

The computing system repeats the following steps 420, 430, 440, and 450 for each MEP system for which routing needs to be performed. The computing system repeats the steps 420 and 430 for a plurality of candidate routes for the selected MEP system. For each individual MEP system, the computing system may test potentially hundreds or even thousands of routing alternatives for intersection with the obstructions using the storage efficient representation based on triangles.

The computing system determines 420 a candidate route for the MEP system. According to an embodiment, the 3D space represents a building being constructed and the computing system receives a set of data points that represent the connection location and characteristics of each of the MEP systems that requires a supply of utilities from the building services. These connection locations are referred to herein as points of utilization. Points of utilization may represent outlets, lights, equipment, plumbing fixtures, air diffusers, and so on. These utilization data points reside within the same tessellated obstructed 3D space representing the building. The computing system further receives data points representing sources of supply that feed the points of utilization. These data points include, for example, the electric service entrance, panelboards, water supply, sewers, fans, etc. The computing system defines where the sources of power, water, air, gas, etc. are located and their characteristics (pressure, capacity, flow rate, voltage, etc.). These supply data points also reside within the tessellated obstructed 3D space. These are referred to as points of supply. The computing system performs routing to connect the points of supply to all of their relevant points of utilization at the minimum possible cost.

The computing system determines whether a route being considered intersects an impenetrable obstruction using the storage efficient representation of the 3D space. Accordingly, the computing system determines whether the route being considered intersects with the plane of any of the triangles in the obstructions of the 3D space. Triangles are the most computationally efficient surface to determine if there is an intersection with a route path. The computing system determines whether the line (or segment) in question intersects with any of the planes of the triangles generated during tessellation.

According to various embodiments the computing system tests overlaps between routes generated and obstructions to determine whether a route is feasible. The computing system compares the proposed route with the obstruction triangle set to determine whether there are collisions. At the time of routing, the computing system determines the proposed segment of each path (a straight line from sub-point A to sub-point B) and the approximate cross-sectional size of the object being routed (diameter of pipe, for example). The computing system performs the calculation to compare the proposed path with the plane of the obstruction triangles to identify any conflicts. The computation is performed by the computing system using the data set of triangles representing the 3D space. Accordingly, the computing system may compare each segment of each path with the data set of obstruction triangles. According to an embodiment, the computing system reduces the overall computational time by ignoring triangles that are not within a threshold of the path being considered. Accordingly, the computing system avoids comparing every segment representing a portion of a routing path with the entire obstruction triangle data set, and only compares the routing path with triangles that are within a threshold distance of the routing path and as a result, may be in conflict with the routing path.

When using the triangle surface representations in the model, the system does not compare against every single triangle of the 3D space. Instead, the system performs a binary search using a binary space partition tree. The binary space partition tree uses a dividing plane that places approximately ½ of the triangles on one side of the plane and ½ on the other side. For each of those halves, the computing system establishes another dividing plane that splits each of those approximately in half, recursively. This allows the system to find intersecting triangles by looking only at the ones that are in the same region as the object being compared, and ignoring the rest, dramatically improving processing time.

Other benefits of the storage efficient 3D space representation model used is that calculating whether an object intersects each triangle in the model can be done in constant time. Also, the technique allows massive parallelization and the system uses multiple processors to determine the route. According to some embodiments, the applications are built to support calculation libraries on video cards, thereby further reducing the processing time. An example such library is CUDA (Compute Unified Device Architecture) that allows for parallel processing and specific instruction sets tuned for processing of graphical elements. Other embodiments use other alternatives.

The computing system is flexible enough to handle shapes other than triangles when computing routes. Some obstructions and system components that need to be routed may be cumbersome or impractical to convert to triangles. Other shapes like circles, cylinders and spheres are built into the database structure. A round pipe, for example, can be represented as a cylinder and two circles. Determining if two cylinders collide is performed by projecting the center line of each cylinder onto each other to determine if the distance between those two lines is less than the sum of the radiuses. A sphere can also be incorporated, although buildings rarely include spheres. These other, non-triangular shapes are built into the database definition to allow easier adaptation of the system to other fields of study, where such non-triangular objects may be more common. Projecting other shapes onto the triangular obstructions is simple to compute. Representations of non-planar surfaces can either be done by course tessellation, as previously described, or through the use of these other shape specifications in the database, depending on the application.

The vast majority of obstructions in buildings are modeled by triangles representing polygonal walls and other surfaces. The system splits any arbitrary polygon into triangles by consecutively chopping off each triangle formed by 3 consecutive points in a convex shape around the edge, until the shape is left with just 3 points in a triangle, therefore the input does not have to be in triangle form, just as polygons or polyhedrons. The triangle comparing obstruction code using a binary space partitioning tree is an efficient platform on which to layer the complex routing algorithms associated with the building services systems and also an extremely efficient platform for identifying and either avoiding or resolving clashes between systems.

The computing system determines 430 the cost of the objects represented by the selected candidate route for the MEP system. Since the routing process represents a complex Steiner tree problem in 3D, which is NP hard (i.e., takes exponential time to process), the computing system generates numerous alternative approximation routes and tests them all for cost to determine which one is actually the most efficient route to take. The number of routes analyzed varies by the number of points of utilization and points of supply. The number of routes analyzed is typically in the thousands for even relatively small 3D space.

If the computing system determines that an intersection occurs with a penetrable triangle, the computing system assigns a cost to that penetration and adds the cost to the overall cost of that system. The computing system may try alternate routes that may avoid that penetration, thereby avoiding the penetration cost.

This process performs the cost calculation for several candidate routes for each MEP system routed. The number of routes of each MEP system that must be coordinated with the routes of all other systems and with the architectural and structural base models is a very large number. The techniques disclosed significantly improve the computational efficiency and memory efficiency and keep the processing time down.

In some embodiments, the computing system marks some obstruction triangles as penetrable without any increase in the cost of the route, like non-rated interior wall partitions. The route can go through a standard unrated wall at essentially zero additional cost to running in free space because there are no special requirements to penetrating an unrated wall. Fire rated walls can be penetrated, but there is a quantifiable cost associated with penetrating it. There are sleeves and fire stopping materials, fire dampers, smoke dampers, etc. required to make the penetration, which all have a known cost per unit that must be added to the cost of that route, when comparing it to other routes generated that may have avoided the rated partition penetrations.

The computing system compares the costs of the various candidate routes for the MEP system to select a candidate route. For example, the computing system may select the candidate route for the MEP system that has the lowest cost of routing. The computing system reconfigures 450 the 3D space to include the selected candidate route for the MEP system as impenetrable objects that act as obstructions for subsequent MEP systems being routed.

The computing system stores the final reconfigured 3D space representation. The computing system may transmit 460 the final reconfigured 3D space representation for display to an expert, for example, to review and provide feedback. The computing system a may provide the final reconfigured 3D space representation for display via an application executing on a client device. The application may allow an expert to view the 3D space configuration and the results of the routing for approval. The application may allow an expert to make modifications to the results of the routing, for example, by manually rerouting certain portions or by changing the input parameters and re-computing new routes. In an embodiment, the computing system sends the final reconfigured 3D space representation back to other applications for construction of the building. For example, developers may view the 3D space representation in Revit or Navisworks and perform the construction of the building.

In an embodiment, the data transformation module 150 transforms the storage efficient representation of the 3D space that is generated by the process illustrated in FIG. 4 back to a detailed representation of the 3D spaces. This allows the reconfigured 3D space that includes the routing information to be processed by various tools configured to process the detailed representation. Accordingly, the 3D spaces are transformed to the storage efficient representation for the purposes of routing and are stored and processed using the detailed representation otherwise.

In addition to the modeling and computational challenges presented by working in three dimensions, the advent of cloud based big data and AI frameworks (AIaaS) has opened up new possibilities to achieve more accurate and dynamic optimizations of the designs than was previously possible using the relatively static, manually updated costing data. Moving these costing analysis functions to the cloud provides access to significantly higher data accuracy, mature ML/AI frameworks to ease programming and the ability for the software to automatically alter the optimized output based on more granular and timely costing data that is only available in the cloud. As material and labor pricing changes, both geographically and over time, the optimization routines adapt automatically by using up-to-the-minute pricing data obtained in the cloud. For example, if the price of copper rises suddenly, alternative designs may emerge that address the increased cost of the raw materials (copper), resulting in a timelier and more accurate optimized solution.

Applications to Building Construction

Embodiments utilize an efficient three-dimensional modeling environment on which the routing optimization programs can function. A 3D model accurately represents the physical constraints of a real world building situation, and ensures that the routes are built within the constraints of the physical possibilities and building code requirements.

The system determines the outer extents of the building or space to be analyzed. For a new construction building, this is the outer boundaries of the walls, roof, floors, etc. In the case of a renovation of a portion of an existing building, this is the boundaries of the remodeled area, or "limits of construction" in the construction industry vocabulary. Once the outer limits of the building or work area are established, the bounded area is accurately divided into the largest inscribed triangles possible, creating a database of the surfaces that make up the building or project. The size of each triangle represented in the digital model is determined to balance the "resolution" accuracy necessary to accurately design a constructible building and the database size and processing time requires to perform the routing optimization algorithms to determine the best possible design solution.

In buildings, the vast majority of the regions of the model are assigned to be occupied space (or impenetrable regions), meaning that specific regions of the building or space remain unencumbered by any type of building system so that it can be used by the humans in the building. Another type of region assigned includes those systems that constitute the physical construction elements of the building. This includes structural elements, finish elements, insulation elements, sheathing and moisture control elements, etc. These regions must also remain unencumbered by any type of building services system, such as pipes, wires, ducts, conduits, etc. Once the occupied space regions and physical construction elements are all modeled functionally, the remaining unassigned regions become available for use by the building services piping, wiring, conduit and ductwork systems.

The remaining available regions are considered penetrable regions for the routing of the building services systems. The routing of the MEP systems is accomplished using the triangular surface based 3D model by executing routing algorithms to solve the variants of the Minimum Spanning Tree and Steiner Tree problems, depending on which is more applicable to the building services system in question. Due to the constructability and code restrictions of these systems, there are multiple rules layered on top of the basic routing calculations to meet the physical constraints of the systems being design.

The system utilizes a 3D model that is accurate and identifies any conflicts or errors before they reach the construction phase of a project. In most cases, any naïve routing algorithms produce a route which would be optimal based on line lengths, but complications like the diameters of ducts or pipes and the length of the fittings preclude the system from being constructible. Being able to identify and correct minor errors so that a nearly-buildable system is made fully buildable is part of embodiments of the invention.

The system determines cost estimates to compare different routes and make system efficiency decisions. This functionality is integrated into the route generation so that the optimization functions can evaluate a large number of possible solutions in the minimal possible time using the most accurate data possible. The system uses machine learning/artificial intelligence platforms in the cloud to determine accurate, ever changing cost criteria to select the routes and sizing chosen as the optimal solution.

The routing algorithms function in 3D without requiring either huge processing power or huge processing time. The same algorithm that completes in a reasonable time frame when evaluated in two-dimensions can prove unreasonable when expanded into a third dimension. This complication is not only in terms of the calculations on the triangular (or other) obstructions encountered as a result of the jump to 3D, but also the very nature of the building services systems themselves. There are numerous constraints and restriction on how these system can be distributed depending on code requirements, physical configuration requirements, sloping requirements, access requirements and others, just to name a few. Additionally, the cost of one segment of a system depends on the cumulative load on all child segments in the tree, so attaching a pipe or duct at a different location can change the costs of all other components throughout the system. Ductwork systems have the added complexity that, unlike plumbing, which has fixed available pipe diameters, an HVAC duct can vary almost infinitely in width and height, which also impacts both the cost and constructability of the system. These cost evaluation functions are part of the embodied work.

In some embodiments, the computing system obtains the most up to date and regionally specific costing data for a given region at the time of the optimization runs. This ensures that the latest cost information is used at the time of optimization. The system may run the routing process multiple times and if the cost for a penetrable region of the 3D space changes during the runs, the computing system may generate a different route that is optimal with respect to the latest cost measures. For example, the cost of routing through a penetrable region may increase and the computing system may select an alternate route that avoids that penetrable region or reduces the portion of the expensive penetrable region through which routing is performed.

With the volatility inherent in construction material and labor pricing, the computing system is able to use the latest (i.e., up to the minute) costs by searching various databases, for example, various data sources from the internet. Contractors price materials and labor with dynamic information. The computing system accesses to multiple platforms to gather real-time pricing data, to generate optimized designs that are more accurate with respect to the current conditions and regional variations. The computing system with regard to pricing gathers as much data as possible and determines what data is most relevant to the current pricing being studied.

According to an embodiment, the computing system uses artificial intelligence (AI) in the routing algorithms with respect to perform heuristic based search for a cost optimal route. The computing system executes algorithms that use the proximity of various devices and multiple possible solution paths to generate a large number of possible alternate routes. The system evaluates each alternate route and compares it to the other alternate routes generated. Once all possible alternate routes are engineered and cost-estimated, the software selects the most cost-efficient solution as the final route. Because the system uses total cost as the metric for determining the best solution, the system generates the most material and labor efficient solution. This is often referred to as generative AI design.

Other Applications

The system according to various embodiments is a computationally efficient 3D modeling environment upon which a wide variety of routing and sizing applications can be developed. Application of routing techniques disclosed include design of building services systems, including plumbing, ductwork and electrical conduit systems. Accordingly, these applications include mechanical, electrical and plumbing (MEP) engineering applications as well as broader applications serving other industries, for example, civil engineering and most infrastructure projects that require routing of utility systems through often complex three-dimensional spaces. Optimization of these utility routes utilizing computer simulations provide initial cost, operating cost and environmental benefits to those industries and the building services sector. Data center design is another application where the disclosed techniques can be used. Data centers contain vast amounts of building services and are extremely expensive to build, maintain and operate. Optimized routing of systems and cabling through data centers provides many cost and environmental benefits. The design and construction cycle is shortened, bringing data centers on line much faster than is required using conventional engineering methods. Embodiments can be further used in gaming, 3D navigation and communications industries. The disclosed techniques result in a significant reduction in waste in the construction industry along with a reduced overall carbon footprint and lower energy consumption for the life of the facility. The time to market of buildings is greatly enhanced.

Modern buildings contain a large number of different building support systems, all of which must be designed by human engineers to 'fit' within the walls, ceilings and floors, usually in concealed spaces, out of the sight of the building occupants. The concealed spaces are very tight and full of many obstructions to the most efficient routing. These obstructions include structural and architectural systems, as well as interferences between the building services systems themselves. As additional building services are routed, they themselves become additional obstructions added to the architectural and structural obstructions that are the baseline condition. This process continues until all building services have been routed within the confined spaces defined as available for these systems. Upon conclusion of the traditional human engineering process, there is no concept of the efficiency of the decisions made along the way. The systems, at best, simply fit in the allocated spaces and are widely divergent from the 'optimum' solution. At worst, the systems do not even fit in the spaces provided resulting in changes and rework during construction to achieve an acceptable outcome, at much greater cost and longer construction timelines than necessary.

Electrical systems may be represented as Minimum Weight Spanning Tree (MWST) problems because building wiring is typically installed as a point-to-point interconnection of the various qualifying devices, with 'homeruns' to the source of supply. Intermediate connection points (vertices) are generally not required for electrical wiring systems design. MWST problems are Complexity Class P problems that can be solved in polynomial time. The routing algorithms are not 'easy' because there a multitude of special rules imposed by either the basic principles of electrical design or specific National Electrical Code mandated requirements that impact how the systems are routed.

Mechanical systems, on the other hand are not connected using point-to-point routings. Mechanical systems, whether piping or ductwork, have a defined direction of flow for every branch, leading from the source of supply (fan or pump) and the point of utilization (diffuser or hydronic unit). Further complications arise because the routings are highly constrained due to the fixed geometry of their connections, fittings and other physical constraints. The pieces and parts that a contractor can use to assemble the system in the field are limited to the geometries and sizes that are available for purchase or fabrication in the marketplace. Embodiments model mechanical systems as Steiner Tree problems, with the points of utilization being represented by the initial point set 'S' of a Steiner Tree problem and the interconnecting fittings representing the Steiner Points of the tree. Some mechanical systems represent Euclidean Steiner Tree problems, where routes are not required to follow specific paths, while others represent Rectilinear Steiner Tree problems because they are forced to route only in either 90 degree angles or sometimes 15, 30 and 45 degree angle increments. Most building services mechanical problems are rectilinear, however some exceptions do exist. The basic Steiner Tree problems are Complexity Class QP, NP-hard, running in quasi-polynomial time. It is generally accepted that there is no polynomial time solution for a Steiner Tree problem.

Instead of attempting to directly solve the Steiner Tree problems, embodiments utilize multiple forms of approximation algorithms, which are run in a brute-force testing of alternative designs. Testing of many different approximations of the most viable potential solutions allows the system to reach a close approximation to the 'optimum' solution for any system.

Whether the systems are based on Minimum Weight Spanning Trees or Steiner Trees, the resulting problem is further complicated by the need to route around obstructions with a constantly increasing and changing number of obstructions as additional systems compete for the same restricted spaces. Routing around fixed obstructions is not considered particularly difficult, although it does make the Steiner Tree problem more complex. However, the problem presents the additional constraint that multiple building systems are competing for the same space, so routing must be done simultaneously on all the domains to ensure that, for example, the HVAC system doesn't conflict with the plumbing system and so on. Additionally, some domains (gravity sewer piping, vent piping, storm water systems and to a lesser degree fire sprinkler piping and water piping systems) have constraints on vertical routing, such as being gravity fed and only allowing for downward sloping of the pipe to ensure complete drainage. Embodiments utilize an efficient three-dimensional environment so that the systems can be designed and rendered under real world conditions, meeting all constructability constraints and avoiding any clashes between the systems and between the systems and the building itself.

Since 3D routing on a single processing machine is likely to overwhelm the resources of any computer, embodiments distribute the work across and aggregate the result from multiple machines. Embodiments ensure that the memory requirements of the underlying database be as lean as possible to avoid overwhelming the memory capacity of the computing platform. The 3D modeling and routing of these systems results in increases in processing requirements and in the computational time complexity. This increase in computational time complexity is addressed using an efficient digital 3D modeling environment and through the use of multiple computing platforms, offering more power than is available within a typical engineering or architectural office. The applications are built on top of a computationally efficient 3D modeling environment that serves as an efficient database of the space available, retaining information about what each region of the space is being used for and what regions of space remain available for other purposes.

There are many existing tools in the marketplace to digitally coordinate building systems in advance of the physical construction of the building. However, these tools are all highly dependent on human operators to perform the coordination work and to make the decisions regarding how and where certain components are to be placed in 3D space to ensure that they do not conflict with each other in the field during construction. This manual process of coordination is extremely costly and highly subject to human error. In addition, the human mind is not capable of determining the most efficient solution to the routing and coordination of the numerous systems that go into constructing a modern building. Decisions made using the conventional tools result in even more inefficiencies in the construction process due to the lack of optimization in those decisions.

Conventional techniques in the MEP software industry are focused on making the human engineer's task easier and more time efficient, while still relying on the human engineer to make the routing and sizing decisions. In contrast, the embodiments of the invention aim to remove the human engineer from the process of routing and sizing the connecting wires, pipes and ducts in building systems design. The system, according to some embodiments, is deployed in a Software-as-a-Service (SaaS) environment to allow engineering firms around the world to tap into the power of the automated design software. The cloud based AI cost data acquisition also allows the system to access vast amounts of up-to-the-minute data regarding the cost of the various materials and labor required, based on the exact geographic location of the construction project. The utilization of real-time cloud based costing data enhances the ability of the software to automatically adjust the optimal design based on fluctuations in the costs of labor and raw materials in any particular market, enhancing its ability to solve the most complex problems in the most timely and efficient manner possible.

Technical Improvements

The techniques disclosed are used to solve complex Minimum Spanning Tree and Steiner Tree problems. For example, routing for purposes of building construction is complicated by the need to account for obstructions, either from the base building or from the other systems that are being concurrently designed to supply all of the systems in the building. The Steiner Tree problem itself is NP-hard, requiring quasi-polynomial time to complete. Dealing with a relatively large, 3D space containing interferences further complicates the routing and optimization process. Embodiments use a computationally efficient 3D modeling environment on which the routing and coordination algorithms can be applied. A 3D modeling environment based on triangular shaped planar representations of the surfaces in the 3D space to be analyzed is utilized to identify the physical boundaries of available space in which to route and coordinate the various systems, avoiding conflicts with the building and with other systems trying to occupy the same available space. Triangles are very efficient computationally and since most components of a building are planar, breaking the building surfaces into the largest possible triangular planes renders a very efficient database for the routing and conflict resolution algorithms. 3D routing algorithms are incorporated in an automated system that designs the building services in a fully coordinated, three-dimensional, optimized solution, with minimal human intervention.

Certain conventional techniques solve the routing problems in 2D space and do not have the ability to operate in three-dimensional space. As a result, these techniques do not have the ability to perform coordination of the systems to ensure no conflicts exist between the various systems designed. The 2D software does not have the ability to deal with three-dimensional obstructions that exist in every building. The 2D software does not have the ability to allow systems to cross each other or route vertically to avoid clashes. The 2D software also does not have the ability to optimize multiple systems to achieve the lowest overall system cost. The system as disclosed performs coordinated 3D modelling and overcomes the shortcomings encountered in the 2D applications. The 3D routing and modeling of the disclosed system provides technical accuracy, quality and optimization, along with improvement in processing requirements and computational time that must be addressed through the development of a more efficient digital 3D modeling environment.

The technique disclosed allow complex data to be represented in storage efficient manner. Accordingly, the techniques improve the computational efficiency of the processes for routing, for example, by making the process memory efficient. The ability to load the entire data set representing the obstructions in memory allows the system to perform the routing process highly efficiently compared to conventional techniques. Conventional techniques store the 3D space data representation in a slower storage device and load only small portions of the data at a time, thereby causing data swapping that significantly slows the performance. In contrast, the techniques disclosed load the entire data set representing the 3D space in memory, thereby avoiding any need for data swapping.

The system as disclosed represents only the surfaces of the obstructions in the database using the largest possible triangles to define each surface. The triangle is known to be the most computationally efficient polygon due to its planar simplicity and the ability to define each additional connecting triangle with only one additional data point. Each triangle has nine 64-bit floating coordinates, for a total of 72 bytes. A cube, regardless of size, would consist of 6 squares, each divided into 2 triangles, so the cube would be represented by 12 triangles and only take up 864 bytes, or a little less than a kilobyte. For example, if there were 1,000 'cubes', or 12,000 triangles in the model, the model would take up less than 1 megabyte and can be loaded into a CPU's level 2 cache. Furthermore, unlike other representations such as point cloud representations, the storage efficient data representation uses the same amount of storage independent of the sizes of the objects being stored. Therefore, if the model has a boundary of 200'×200'×50', representing that boundary would take only 864 bytes using triangles (6 faces*2 triangles*3 vertices*3 coordinates*64 bits=6912 bits/8 bits per byte=864 bytes) vs. 3.3 GB with a ½' resolution 3D voxel bitmap. In addition, using triangles to represent surfaces is accurate to far more decimal places than can be handled by conventional techniques. For example, the bitmap approach is limited to the resolution chosen to represent the space.

Triangle strips reduce the memory burden of the model, since each additional triangle only adds one additional vertex point to the database. Using a single triangle strip, the same cube is represented by 14 vertices*3 coordinates*64 bits=2688 bits/8 bits per byte=336 bytes per cube. Triangle strips are applied to the database to further reduce its size. In addition to the geometric information to be stored, additional overhead varies from 8 to 68 bytes, depending on how the metadata is structured. An empty object with no data in C# is 24 bytes, with an extra 4 bytes for an array to store the length, and each pointer is 8 bytes, so if there is a separate object and array for each strip, the data can be stored in 68 bytes.

Furthermore, the techniques improve the user experience by automating the entire process of routing. Conventional techniques are unable to complete the routing process due to their slow performance. As a result, users are involved frequently to provide input where the computing system fails. This makes the entire process slow, cumbersome, and error prone. Since the storage efficient data representation allows the system to try various candidate routes very efficiently, the system is able to complete the entire routing process and present the final cost-efficient route to the user without any user involvement. As a result, the technique disclosed provide a much improved user interface and user experience.

There are application specific advantages of the techniques. For example, for building construction, since the system finds the most efficient routing solutions, there are several advantages including, reduced environmental impact, lower embodied carbon, lower operational carbon, energy savings, material efficiency, labor efficiency and reduced waste. Human routing of systems is inherently inefficient due to the complexity of calculations required to find the most efficient route.

Conflicts between the structural, architectural and building services components (pipes, ducts, equipment and conduits) remain one of the most difficult to solve and costly failures in the building construction process. Identification of these conflicts usually occurs in the field, while the building is being constructed, resulting in construction delays, change orders and budget overruns. Removal and rework of systems presents a very significant inefficiency in the construction industry. Studies have found that re-work on construction projects in the United States accounts for approximately 5-6% of the total cost of constructing the building. Assuming 5.5% of the 'Annual Value of Construction Put in Place' during 2019 per the United States Census Bureau, construction re-work accounts for approximately $75 billion in waste on an annual basis in the US alone. The techniques disclosed eliminate the waste by eliminating the need for rework since the storage efficient representation allows the system to efficiently explore large search spaces and find the cost optimal solution.

Embodiments significantly reduce the cost, time, materials and labor used in the construction process and reduce the operational cost for the life of the building. The system according to various embodiments addresses multiple forms of waste in the design and construction process, dramatically reducing the amount of raw material, labor, embodied carbon, operational carbon, and construction waste required to build and operate a building. Computer automation of this process significantly reduces the time to completion of the project, resulting in profitable use of the facility at an earlier date than previously possible, providing a positive benefit for the economy.

Computer Architecture

Figure 5:
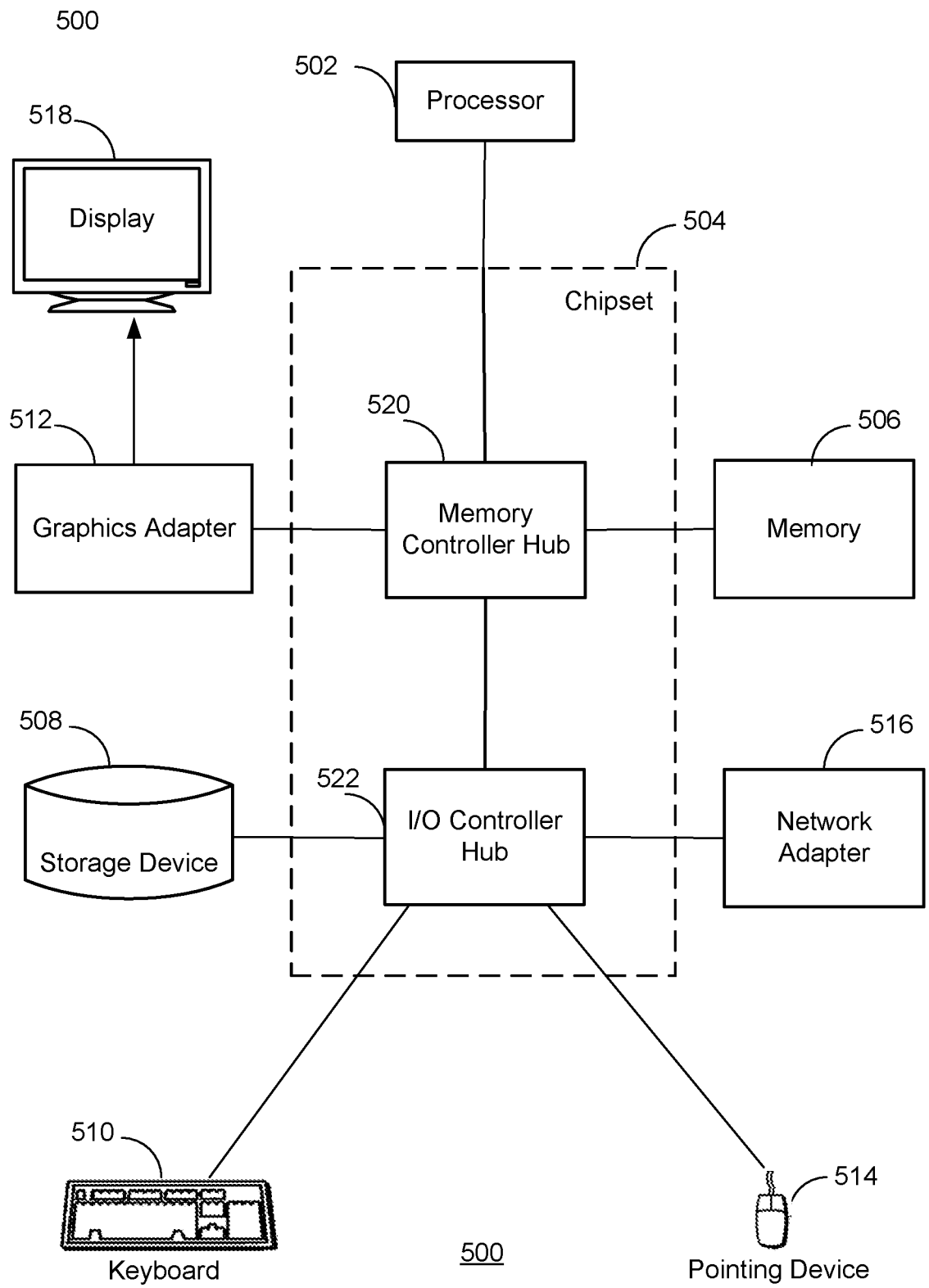
FIG. 5 is a block diagram illustrating a functional view of a typical computer system according to one embodiment.

FIG. 5 is a high-level block diagram illustrating a functional view of a typical computer system for use as one of the entities illustrated in the environment 100 of FIG. 1 according to an embodiment. Illustrated are at least one processor 502 coupled to a chipset 504. Also coupled to the chipset 504 are a memory 506, a storage device 508, a keyboard 510, a graphics adapter 512, a pointing device 514, and a network adapter 516. A display 518 is coupled to the graphics adapter 512. In one embodiment, the functionality of the chipset 504 is provided by a memory controller hub 520 and an I/O controller hub 522. In another embodiment, the memory 506 is coupled directly to the processor 502 instead of the chipset 504.

The storage device 508 is a non-transitory computer-readable storage medium, such as a hard drive, compact disk read-only memory (CD-ROM), DVD, or a solid-state memory device. The memory 506 holds instructions and data used by the processor 502. The pointing device 514 may be a mouse, track ball, or other type of pointing device, and is used in combination with the keyboard 510 to input data into the computer system 500. The graphics adapter 512 displays images and other information on the display 518. The network adapter 516 couples the computer system 500 to a network.

As is known in the art, a computer 500 can have different and/or other components than those shown in FIG. 5. In addition, the computer 500 can lack certain illustrated components. For example, a computer system 500 may lack a keyboard 510 and a pointing device 514. Moreover, the storage device 508 can be local and/or remote from the computer 500 (such as embodied within a storage area network (SAN)).

The computer 500 is adapted to execute computer modules for providing the functionality described herein. As used herein, the term "module" refers to computer program instruction and other logic for providing a specified functionality. A module can be implemented in hardware, firmware, and/or software. A module can include one or more processes, and/or be provided by only part of a process. A module is typically stored on the storage device 508, loaded into the memory 506, and executed by the processor 502.

The types of computer systems 500 used by the entities of FIG. 1 can vary depending upon the embodiment and the processing power used by the entity. For example, a client device may be a mobile phone with limited processing power, a small display 518, and may lack a pointing device 514. The computing system, in contrast, may comprise multiple blade servers working together to provide the functionality described herein.

Additional Considerations

The particular naming of the components, capitalization of terms, the attributes, data structures, or any other programming or structural aspect is not mandatory or significant, and the mechanisms that implement the embodiments described may have different names, formats, or protocols. Further, the systems may be implemented via a combination of hardware and software, as described, or entirely in hardware elements. Also, the particular division of functionality between the various system components described herein is merely exemplary, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain embodiments described herein include process steps and instructions described in the form of an algorithm. It should be noted that the process steps and instructions of the embodiments could be embodied in software, firmware or hardware, and when embodied in software, could be downloaded to reside on and be operated from different platforms used by real time network operating systems.

The embodiments described also relate to apparatuses for performing the operations herein. An apparatus may be specially constructed for the required purposes, or it may comprise a general-purpose computer selectively activated or reconfigured by a computer program stored on a computer readable medium that can be accessed by the computer. Such a computer program may be stored in a non-transitory computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the, along with equivalent variations. In addition, the present embodiments are not described with reference to any particular programming language. It is appreciated that a variety of programming languages may be used to implement the teachings of the embodiments as described herein.

The embodiments are well suited for a wide variety of computer network systems over numerous topologies. Within this field, the configuration and management of large networks comprise storage devices and computers that are communicatively coupled to dissimilar computers and storage devices over a network, such as the Internet.

Finally, it should be noted that the language used in the specification has been principally selected for readability and instructional purposes, and may not have been selected to delineate or circumscribe the inventive subject matter. Accordingly, the disclosure of the embodiments is intended to be illustrative, but not limiting.

What is claimed is:

1. A computer implemented method for generating a data representation of a three-dimensional space for automated routing through obstructions, the method comprising:
 receiving a detailed data representation of the three-dimensional space comprising a set of objects, the three-dimensional space comprising one or more regions marked as impenetrable regions and one or more regions marked as penetrable regions;
 generating the data representation for the three-dimensional space, the generating comprising:
  filtering to eliminate at least a subset of objects from the set of objects of the three-dimensional space, wherein an object is eliminated responsive to determining that the object is located within an impenetrable object; and
  performing tessellation to determine a plurality of triangles to represent surfaces of the objects in the detailed data representation of the three-dimensional space; and
 iteratively and automatically generating a plurality of routes through the three-dimensional space using the data representation of the three-dimensional space in different sequences, wherein each of the plurality of routes comprises a three-dimensional shape configured to accommodate a mechanical, electrical, or plumbing (MEP) system that is permitted to overlap with a penetrable region and not permitted to overlap with an impenetrable region;
 determining a sequence of generating the plurality of routes in the different sequences that optimizes a measure of cost of routing through the three-dimensional space based on the plurality of routes generated in the different sequences, and wherein optimizing the measure of cost comprises using machine learning to generate each route automatically for reducing an amount of material required to construct the MEP system; and
 transmitting information describing the generated plurality of routes in the determined sequence to a client device.

2. The method of claim 1, wherein determining the plurality of triangles to represent the surfaces of objects comprises minimizing a number of the triangles generated from each surface.

3. The method of claim 1, wherein determining the plurality of triangles to represent surfaces of objects comprises maximizing a size of each triangle generated from each surface.

4. The method of claim 1, wherein generating the route through the three-dimensional space using the data representation of the three-dimensional space comprises modifying the three-dimensional space to include objects being routed.

5. The method of claim 1, further comprising receiving a request for automated routing through the three-dimensional space, wherein the request to determine the route through the three-dimensional space represents a request to determine a route for each of a plurality of systems, each system representing a type of objects being routed.

6. The method of claim 5, for each sequence of the different sequences, iteratively and automatically generating a plurality of routes comprising:
   determining a first route for a first MEP system based on the sequence;
   modifying the three-dimensional space to include objects representing the route, wherein the objects representing the first route are included as the impenetrable objects; and
   determining remaining routes for remaining systems using the modified three-dimensional space based on the sequence.

7. The method of claim 1, performing a binary search to identify the plurality of triangles close to the route to determine potential collisions between the routes and both the penetrable and impenetrable objects.

8. A non-transitory computer readable storage medium storing instructions that when executed by a computer processor, cause the computer processor to perform steps for generating a data representation of a three-dimensional space for routing through obstructions, the steps comprising:
   receiving a detailed data representation of the three-dimensional space comprising a set of objects, the three-dimensional space comprising one or more regions marked as impenetrable regions and one or more regions marked as penetrable regions;
   generating the data representation for the three-dimensional space, the generating comprising:
      filtering to eliminate at least a subset of objects from the set of objects of the three-dimensional space, wherein an object is eliminated responsive to determining that the object is located within an impenetrable object; and
      performing tessellation to determine a minimum number of triangles required to represent surfaces of the objects in the detailed data representation of the three-dimensional space; and
   iteratively and automatically generating a plurality of routes through the three-dimensional space using the data representation of the three-dimensional space in different sequences, wherein each of the plurality of routes comprises a three-dimensional shape configured to accommodate a mechanical, electrical, or plumbing (MEP) system that is permitted to overlap with a penetrable region and not permitted to overlap with an impenetrable region;
   determining a sequence of generating the plurality of routes in the different sequences that optimizes a measure of cost of routing through the three-dimensional space based on the plurality of routes generated in the different sequences, and wherein optimizing the measure of cost comprises using machine learning to generate each route automatically for reducing an amount of material required to construct MEP system; and
   transmitting information describing the generated plurality of routes in the determined sequence to a client device.

9. The non-transitory computer readable storage medium of claim 8, wherein determining the minimum number of triangles to represent surfaces of objects comprises minimizing the number of triangles generated from each surface.

10. The non-transitory computer readable storage medium of claim 8, wherein determining triangles to represent surfaces of objects comprises maximizing a size of each triangle generated from each surface.

11. The non-transitory computer readable storage medium of claim 8, wherein generating the route through the three-dimensional space using the storage data representation of the three-dimensional space comprises modifying the three-dimensional space to include objects being routed.

12. The non-transitory computer readable storage medium of claim 8, wherein the steps further comprise receiving a request for automated routing through the three-dimensional space represents a request to determine a route for each of a plurality of systems, each system representing a type of objects being routed.

13. The non-transitory computer readable storage medium of claim 12, for each sequence of the different sequences, iteratively and automatically generating a plurality of routes comprising:
   determining a first route for a first system based on the sequence;
   modifying the three-dimensional space to include objects representing the route, wherein the objects representing the first route are included as the impenetrable objects; and
   determining remaining routes for remaining systems using the modified three-dimensional space based on the sequence.

14. The non-transitory computer readable storage medium of claim 8, performing a binary search to identify the minimum number of triangles close to the route to determine potential collisions between the routes and impenetrable objects.

15. A computer system comprising:
   a computer processor; and
   a non-transitory computer readable storage medium storing instructions that when executed by a computer processor, cause the computer processor to perform steps for generating a data representation of a three-dimensional space for routing through obstructions, the steps comprising:
      receiving a detailed data representation of the three-dimensional space comprising a set of objects, the three-dimensional space comprising one or more regions marked as impenetrable regions and one or more regions marked as penetrable regions;
      generating a data representation for the three-dimensional space, the generating comprising:
         filtering to eliminate at least a subset of objects from the set of objects of the three-dimensional space, wherein an object is eliminated responsive to determining that the object is located within an impenetrable object; and
         performing tessellation to determine a plurality of triangles to represent surfaces of the objects in the detailed data representation of the three-dimensional space; and
      iteratively and automatically generating a plurality of routes through the three-dimensional space using the data representation of the three-dimensional space in different sequences, wherein each of the plurality of routes comprises a three-dimensional shape configured to accommodate a mechanical, electrical, or plumbing (MEP) system that is permitted to overlap with a penetrable region and not permitted to overlap with an impenetrable region;
      determining a sequence of generating the plurality of routes in the different sequences that optimizes a measure of cost of routing through the three-dimensional space based on the plurality of routes generated in the different sequences, and wherein optimizing the measure of cost comprises using machine learning to generate each route automatically for reducing an amount of material required to construct the MEP system; and transmitting information describing the generated plurality of routes in the determined sequence to a client device.

16. The computer system of claim 15, wherein determining triangles to represent surfaces of objects comprises minimizing a number of triangles generated from each surface.

17. The computer system of claim 15, wherein determining triangles to represent surfaces of objects comprises maximizing a size of triangles generated from each surface.

18. The computer system of claim 15, wherein generating the route through the three-dimensional space using the data representation of the three-dimensional space comprises modifying the three-dimensional space to include objects being routed.

19. The computer system of claim 15, wherein the steps further comprise receiving a request for automated routing through the three-dimensional space represents a request to determine a route for each of a plurality of systems, each system representing a type of objects being routed.

20. The computer system of claim 19, for each sequence of the different sequences, iteratively and automatically generating a plurality of routes comprising:

determining a first route for a first system based on the sequence;

modifying the three-dimensional space to include objects representing the route, wherein the objects representing the route are included as impenetrable objects; and determining remaining routes for remaining systems using the modified three-dimensional space based on the sequence.

\* \* \* \* \*